United States Patent [19]

Davison et al.

[11] Patent Number: 5,593,538
[45] Date of Patent: Jan. 14, 1997

[54] METHOD FOR ETCHING A DIELECTRIC LAYER ON A SEMICONDUCTOR

[75] Inventors: Michael J. Davison; Paul W. Dryer; Wendy K. Wilson, all of Mesa, Ariz.

[73] Assignee: Motorola, Inc., Schaumburg, Ill.

[21] Appl. No.: 537,053

[22] Filed: Sep. 29, 1995

[51] Int. Cl.$^6$ ............................................. H01L 21/311
[52] U.S. Cl. .......................... 156/637.1; 156/656.1; 156/626.1; 156/642.1; 216/90; 216/84; 216/93
[58] Field of Search ............................. 216/57, 83, 96, 216/86; 156/657.1, 662.1, 642.1

[56] References Cited

U.S. PATENT DOCUMENTS

| | | | |
|---|---|---|---|
| 4,795,582 | 1/1989 | Ohmi et al. | 252/79.3 |
| 4,799,991 | 1/1989 | Dockrey | 156/643 |
| 4,828,751 | 5/1989 | Kremer | 252/171 |
| 4,971,654 | 11/1990 | Schnegg et al. | 156/638 |
| 5,000,207 | 3/1991 | Titterington et al. | 134/44 |
| 5,464,480 | 11/1995 | Matthews | 134/1.3 |
| 5,468,338 | 11/1995 | Shahid | 216/90 |

OTHER PUBLICATIONS

Kerns et al., RCA REVIEW, pp. 188–190, Jun. 1970.
Pieter Burggraaf, Semiconductor International, "Wet Processing: Alive, Well and Futuristic", Jul. 1990, pp. 59–63.

*Primary Examiner*—R. Bruce Breneman
*Assistant Examiner*—Michael E. Adjodha
*Attorney, Agent, or Firm*—Rennie William Dover

[57] ABSTRACT

A wet etching process (10) etches sacrificial oxide on a substrate without damaging a polycrystalline silicon structure on the substrate. The etching process (10) includes dipping the substrate in a surfactant (11), submerging a portion of the substrate in a recirculating bath of the etchant while injecting an inert gas into the etchant (12) to purge the etchant of oxygen, rinsing the substrate in deionized water (14), submerging a portion of the substrate in a hydrogen peroxide solution (15), rinsing the substrate for a second time (17), and drying the substrate in isopropyl alcohol vapor (18). The inert gas injected into the etchant displaces oxygen dissolved in the etchant and protects the polycrystalline silicon structure from being etched.

20 Claims, 1 Drawing Sheet

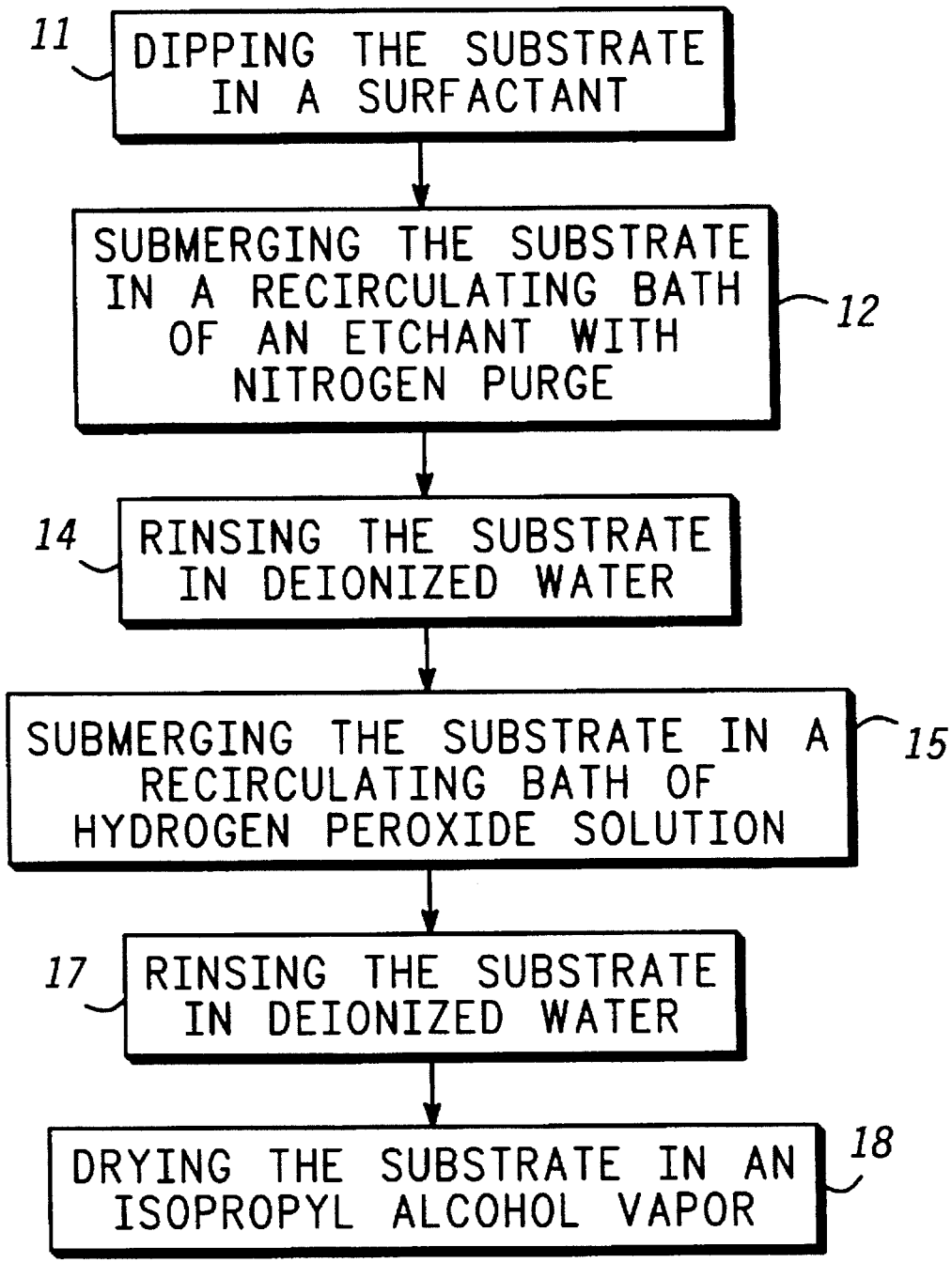

METHOD FOR ETCHING A DIELECTRIC LAYER ON A SEMICONDUCTOR

BACKGROUND OF THE INVENTION

The present invention relates, in general, to etching a substrate, and more particularly, to etching a dielectric material over a semiconductor material.

Wet etching is widely used in semiconductor processing for removing dielectric material, e.g., oxide, from a semiconductor wafer. In one wet etching process, an etchant such as a six to one buffered oxide etchant (6:1 BOE), which consists of six parts of ammonia fluoride and one part of hydrogen fluoride, is used to etch an oxide layer, such as a phosphorus doped silicate glass (PSG) layer, on a semiconductor wafer. The process starts with dipping the semiconductor wafer into a surfactant. The semiconductor wafer is then submerged into a recirculating bath of the etchant to etch the sacrificial oxide. After etching, the semiconductor wafer is rinsed in deionized water and then dried in an isopropyl alcohol vapor. In some applications, e.g., in sensor applications, the semiconductor wafer is submerged in a hydrogen peroxide solution after it is rinsed in the deionized water, followed by a second deionized water rinse before being dried in the isopropyl alcohol vapor.

If the semiconductor wafer includes a conductive structure such as a polycrystalline silicon structure, the polycrystalline silicon structure is exposed to the etchant after the sacrificial oxide is etched away. The etchant etches the polycrystalline silicon, wherein the extent of the etching is dependent on the composition and temperature of the etchant as well as the duration of the etching process. If the polycrystalline silicon is structured as thin conductive lines electrically connecting different components on the semiconductor wafer, the etching process can create open circuits in some areas on the wafer. The etching process also creates reliability problems when a polycrystalline silicon line is etched to a very thin line because a thin line cannot carry the current required for the circuit in the semiconductor wafer to perform properly.

Accordingly, it would be advantageous to have a process for etching a dielectric material over a semiconductor wafer that does not damage a conductive structure on the wafer. It would be of further advantage for the etching process to be simple and easily integrated into an existing etching process.

BRIEF DESCRIPTION OF THE DRAWING

The sole FIGURE is a flow chart of an etching process in accordance with an embodiment of the present invention.

DETAILED DESCRIPTION OF THE DRAWING

Generally, the present invention provides a method for etching a substrate. More particularly, the present invention provides a wet etching process for an oxide layer on a semiconductor material.

In a wet etching process in accordance with a prior art embodiment, polycrystalline silicon is etched when it is exposed to an etchant. The etching of the polycrystalline silicon may cause open polycrystalline silicon lines in some areas as well as reliability problems by creating very thin polycrystalline silicon lines. An objective of the present invention is to provide an etching process that does not etch a conductive structure such as, for example, a polycrystalline silicon structure, on a semiconductor wafer. Through an extensive investigation, it has been discovered that the etching of the polycrystalline silicon structure is caused by oxygen dissolved in the etchant. Therefore, the present invention provides a method for protecting the conductive structure on a substrate during a wet etching process by purging away oxygen dissolved in the etchant.

The sole FIGURE is a flow chart 10 of an etching process in accordance with an embodiment of the present invention. To protect a conductive structure, e.g., a polycrystalline silicon structure, on the substrate during the etching process, an inert gas such as, for example, nitrogen gas is injected into the etchant. The injected inert gas protects the polycrystalline silicon on the semiconductor wafer by purging away or displacing the oxygen dissolved in the etchant. In other words, the injected inert gas serves as a purgative gas to purge the etchant of oxygen, thereby forming a purged or degassed etchant. Other gases suitable for serving as the purgative gas to be injected into the etchant include carbon dioxide, helium, neon, argon, krypton, xenon, and the like.

The etching process illustrated by flow chart 10 is suitable for etching a dielectric material such as a sacrificial oxide from a substrate such as, for example, a semiconductor wafer. Commonly used sacrificial oxides in semiconductor industry include phosphorus doped silicate glass, tetra methyl phosphite, and the like.

In a first step 11, the substrate is dipped in a surfactant for a time period such as, for example, one minute. By way of example, the surfactant is a poly oxyalkylene alkylphenyl ether aqueous solution sold under trademark NCW 601A by Waco Chemical.

In a second step 12, a portion of the substrate is submerged in a recirculating bath of an etchant such as, for example, a six to one buffered oxide etchant (6:1 BOE) consisting of six parts of ammonia fluoride and one part of hydrogen fluoride. The temperature of the etchant and the substrate submersion time will determine the extent of the etching. In one example, the temperature of the etchant is set at 35 degrees Celsius (°C.) and the substrate is submerged in the etchant for 70 minutes. An inert gas such as, for example, nitrogen gas, is injected into the etchant to purge the etchant of the oxygen. In one approach, the inert gas is injected while the etchant is flowing in a recirculating path. In the approach, a tub having at least one injector installed at the bottom of the tub is filled with the etchant. To achieve a uniform etching environment in the tub, several injectors are preferably installed at the bottom of the tub with the injectors evenly distributed throughout the bottom of the tub. Recirculation of the etchant is established by overfilling the tub with the etchant. The portion of the etchant that overflows the tub is collected in a recirculating path, pumped through a filter, and injected back into the tub via the injectors. The inert gas is injected into the etchant in a direction opposite to the flow of etchant along the recirculating path. This approach ensures that a maximum amount of the inert gas is dissolved in the etchant. The inert gas dissolved in the etchant displaces the oxygen and protects the polycrystalline silicon structure from being etched. It is usually preferred to inject the inert gas into the etchant throughout the whole etching process. However, this is not always necessary. The inert gas can be injected into the etchant to purge away the oxygen prior to the etching process. It should be understood that the composition and the temperature of the etchant, and the length of the etching process are not limited to the values described supra. These parameters can be adjusted to optimize each etching process. It should also be understood that the protection provided by the injected inert gas is not limited to a polycrystalline silicon structure. Any structure on the substrate that reacts with the oxygen dissolved in the etchant is protected by the etching process of the present invention.

In a third step 14, the substrate is rinsed in a circulating bath of deionized water. A pair of probes connected to a resistance meter are placed in the bath. As those skilled in the art are aware, pure deionized water has a very low conductivity, i.e., a very high resistivity. If the two probes are placed one centimeter apart, the resistance meter registers approximately 18 mega-ohms (MΩ) for pure deionized water. At the beginning of the rinsing process, the resistance meter registers a resistance value approaching zero because the etchant dissolved in the deionized water has a high electrical conductivity. As the rinsing process continues, the concentration of the etchant dissolved in the deionized water decreases, resulting in a decreased conductivity. The substrate is considered to be sufficiently rinsed when the deionized water in the circulating bath becomes substantially nonconductive. For example, the rinsing process continues until the resistance meter registers a resistance value higher than a predetermined value such as, for example, 10MΩ. It should be noted that the criteria of how long the rinsing process continues is not limited to sensing the conductivity of the deionized water. In another approach, the rinsing process is set to last for a predetermined time period.

In a fourth step 15, the substrate is submerged in a recirculating bath of hydrogen peroxide solution having a concentration of, for example, 30 percent (%). This step of bathing the substrate in hydrogen peroxide lasts for a time period such as, for example, 15 minutes.

In a fifth step 17, the substrate is rinsed in a circulating bath of deionized water as in step 14.

It should be noted that, although preferred in some applications, step 15 and step 17 are optional.

In a sixth step 18, the substrate is dried in an environment of circulating isopropyl alcohol vapor having a concentration of, for example, 70%, and at a temperature such as, for example, 180° C. The isopropyl alcohol vapor absorbs the moisture on the substrate.

By now it should be appreciated that a method for etching a substrate has been provided. The etching process in accordance with the present invention protects the polycrystalline silicon on the substrate from being etched by displacing the oxygen dissolved in the etchant. The process is simple and easy to implement by injecting an inert gas into the etchant.

What is claimed is:

1. A method for etching a dielectric layer on a semiconductor, comprising the steps of:

providing a semiconductor substrate having the dielectric layer disposed thereon;

providing a purged etchant; and submerging a portion of the semiconductor substrate in the purged etchant to etch the dielectric layer on the semiconductor substrate.

2. The method for etching a dielectric layer on a semiconductor as claimed in claim 1, wherein step of providing a purged etchant includes injecting a purgative gas into an etchant to purge the etchant.

3. The method for etching a dielectric layer on a semiconductor as claimed in claim 2, wherein the step of injecting a purgative gas into an etchant includes injecting a gas selected from the group consisting of nitrogen, carbon dioxide, helium, neon, argon, krypton, and xenon.

4. The method for etching a dielectric layer on a semiconductor as claimed in claim 2, wherein the step of injecting a purgative gas into an etchant includes the steps of:

generating a recirculating path for the etchant;

installing a filter in the recirculating path; and injecting the purgative gas into the etchant in a direction opposite to a flow of the etchant while the etchant is flowing through the recirculating path.

5. The method for etching a dielectric layer on a semiconductor as claimed in claim 4, wherein the step of generating a recirculating path includes the steps of:

providing a tub having a bottom, wherein the bottom has at least one injector;

filling the tub with the etchant, wherein the etchant overflows the tub; and pumping the etchant overflowing the tub through the recirculating path to the tub via the at least one injector.

6. The method for etching a dielectric layer on a semiconductor as claimed in claim 1, further comprising the step of dipping the semiconductor substrate in a surfactant before submerging a portion of the semiconductor substrate in the purged etchant.

7. The method for etching a dielectric layer on a semiconductor as claimed in claim 1, further comprising the steps of:

rinsing the semiconductor substrate after the step of submerging a portion of the semiconductor substrate in the purged etchant; and drying the semiconductor substrate after the step of rinsing the semiconductor substrate.

8. The method for etching a dielectric layer on a semiconductor as claimed in claim 7, wherein the step of rinsing the semiconductor substrate includes the steps of:

placing the semiconductor substrate in a circulating bath of deionized water;

sensing a conductivity of the deionized water; and removing the semiconductor substrate from the circulating bath in response to the circulating bath of deionized water being substantially nonconductive.

9. The method for etching a dielectric layer on a semiconductor as claimed in claim 7, wherein the step of drying the semiconductor substrate includes placing the semiconductor substrate in an isopropyl alcohol vapor.

10. The method for etching a dielectric layer on a semiconductor as claimed in claim 7, further comprising the step of bathing the semiconductor substrate in hydrogen peroxide after the step of rinsing the semiconductor substrate and before the step of drying the semiconductor substrate, wherein the step of bathing the semiconductor substrate in hydrogen peroxide includes the steps of:

submerging a portion of the semiconductor substrate in a hydrogen peroxide solution; and rinsing the semiconductor substrate after the step of submerging a portion of the semiconductor substrate in a hydrogen peroxide solution.

11. A method for etching a dielectric material over a semiconductor material, comprising the steps of:

providing a bath of an etchant;

injecting a purgative gas into the etchant;

submerging a portion of the semiconductor material in the bath;

rinsing the semiconductor material after the step of submerging a portion of the semiconductor material in the bath; and drying the semiconductor material after the step of rinsing the semiconductor material.

12. The method for etching a dielectric material over a semiconductor material as claimed in claim 11, wherein the step of injecting a purgative gas includes injecting a gas selected from the group consisting of nitrogen, carbon dioxide, helium, neon, argon, krypton, and xenon.

13. The method for etching a dielectric material over a semiconductor material as claimed in claim 11, wherein the step of injecting a purgative gas includes the steps of:

generating a recirculating path for the etchant;

installing a filter in the recirculating path; and injecting the purgative gas into the etchant in a direction opposite to a flow of the etchant while the etchant is flowing through the recirculating path.

14. The method for etching a dielectric material over a semiconductor material as claimed in claim 11, further comprising the step of dipping the semiconductor material in a surfactant before submerging a portion of the semiconductor material in the bath.

15. The method for etching a dielectric material over a semiconductor material as claimed in claim 11, further comprising the step of bathing the semiconductor material in hydrogen peroxide after the step of rinsing the semiconductor material and before the step of drying the semiconductor material, wherein the step of bathing the semiconductor material in hydrogen peroxide includes the steps of:

submerging a portion of the semiconductor material in a hydrogen peroxide solution; and rinsing the semiconductor material after the step of submerging a portion of the semiconductor material in the hydrogen peroxide solution.

16. A method for etching an oxide layer on a semiconductor wafer, comprising the steps of:

dipping the semiconductor wafer in a surfactant;

injecting a purgative gas into a tub filled with an etchant;

submerging a portion of the semiconductor wafer in the tub;

rinsing the semiconductor wafer after submerging a portion of the semiconductor wafer in the tub; and drying the semiconductor wafer after rinsing the semiconductor wafer.

17. The method for etching an oxide layer on a semiconductor wafer as claimed in claim 16, wherein the step of injecting a purgative gas includes injecting a gas selected from the group consisting of nitrogen, carbon dioxide, helium, neon, argon, krypton, and xenon.

18. The method for etching an oxide layer on a semiconductor wafer as claimed in claim 16, wherein the step of injecting a purgative gas includes the steps of:

generating a recirculating path for the etchant in the tub;

installing a filter in the recirculating path;

pumping a portion of the etchant in the tub through the recirculating path;

injecting the purgative gas into the etchant in a direction opposite to a flow of the etchant while the etchant is flowing through the recirculating path; and pumping the etchant with the purgative gas in the recirculating path to the tub via at least one injector located at a bottom of the tub.

19. The method for etching an oxide layer on a semiconductor wafer as claimed in claim 16, further comprising the step of bathing the semiconductor wafer in hydrogen peroxide after the step of rinsing the semiconductor wafer and before the step of drying the semiconductor wafer, wherein the step of bathing the semiconductor wafer in hydrogen peroxide includes the steps of:

submerging a portion of the semiconductor wafer in a hydrogen peroxide solution; and rinsing the semiconductor wafer after the step of submerging a portion of the semiconductor wafer in the hydrogen peroxide solution.

20. A method for etching a dielectric layer over a semiconductor material, comprising the step of using a degassed etchant solution to etch the dielectric layer.

* * * * *